US012769202B2

(12) United States Patent
Sasaki

(10) Patent No.: US 12,769,202 B2
(45) Date of Patent: Oct. 20, 2026

(54) METHOD FOR MANUFACTURING ELECTROFORMING MOLD AND PHOTOMASK

(71) Applicant: CITIZEN WATCH CO., LTD., Tokyo (JP)

(72) Inventor: Yousuke Sasaki, Sayama (JP)

(73) Assignee: CITIZEN WATCH CO., LTD., Tokyo (JP)

( * ) Notice: Subject to any disclaimer, the term of this patent is extended or adjusted under 35 U.S.C. 154(b) by 538 days.

(21) Appl. No.: 18/283,789

(22) PCT Filed: Mar. 23, 2022

(86) PCT No.: PCT/JP2022/013484
§ 371 (c)(1),
(2) Date: Sep. 23, 2023

(87) PCT Pub. No.: WO2022/210159
PCT Pub. Date: Oct. 6, 2022

(65) Prior Publication Data

US 2024/0176229 A1 May 30, 2024

(30) Foreign Application Priority Data

Mar. 29, 2021 (JP) ................................ 2021-054711

(51) Int. Cl.
*G03F 1/70* (2012.01)
*C25D 1/10* (2006.01)

(52) U.S. Cl.
CPC *G03F 1/70* (2013.01); *C25D 1/10* (2013.01)

(58) Field of Classification Search
CPC .................................. G03F 1/70; C25D 1/10
USPC ............................................................ 430/5
See application file for complete search history.

(56) References Cited

U.S. PATENT DOCUMENTS

| | | | | |
|---|---|---|---|---|
| 5,298,365 | A | 3/1994 | Okamoto | |
| 5,663,893 | A | 9/1997 | Wampler | |
| 5,920,487 | A * | 7/1999 | Reich | G03F 1/36 700/121 |

(Continued)

FOREIGN PATENT DOCUMENTS

| | | | |
|---|---|---|---|
| CN | 108073033 | A | 8/2021 |
| JP | S63216052 | A | 9/1988 |

(Continued)

OTHER PUBLICATIONS

International Search Report from corresponding International Application No. PCT/JP2022/013484, mailed on May 24, 2022, 4 pages.

(Continued)

*Primary Examiner* — Caleen O Sullivan
(74) *Attorney, Agent, or Firm* — Tucker Ellis LLP

(57) ABSTRACT

A method for manufacturing an electroforming mold, the method including: forming a pattern including a soluble portion and an insoluble portion in a photoresist layer stacked on a substrate; removing the soluble portion to form a cavity; and when a corner portion is formed in the soluble portion, forming a soluble portion corner correction portion that is configured to suppress a decrease in sharpness of the corner portion of the soluble portion in a region facing the corner portion of the soluble portion across a vertex of the corner portion of the soluble portion.

2 Claims, 7 Drawing Sheets

(56) References Cited

U.S. PATENT DOCUMENTS

| | | | | |
|---|---|---|---|---|
| 5,965,302 | A | 10/1999 | Horikawa | |
| 2003/0087193 | A1* | 5/2003 | Okada | G03F 7/70466 430/394 |
| 2003/0162103 | A1* | 8/2003 | Oshima | G03F 1/36 430/296 |
| 2011/0269060 | A1 | 11/2011 | Shishido | |

FOREIGN PATENT DOCUMENTS

| | | | |
|---|---|---|---|
| JP | 2005-173059 | A | 6/2005 |
| JP | 2007046109 | A | 2/2007 |
| JP | 2008-240142 | A | 10/2008 |
| JP | 4550569 | B2 | 9/2010 |
| JP | 2016057158 | A | 4/2016 |

OTHER PUBLICATIONS

Office Action from counterpart Chinese Application No. 202280024380.5, mailed Jun. 27, 2026, 12 pages with translation.

* cited by examiner

METHOD FOR MANUFACTURING ELECTROFORMING MOLD AND PHOTOMASK

CROSS-REFERENCE TO RELATED APPLICATION

The present application claims priority based on Japanese Patent Application No. 2021-054711 filed with the Japan Patent Office on Mar. 29, 2021, the entire disclosure of which is entirely incorporated herein by reference.

TECHNICAL FIELD

The present disclosure relates to a method for manufacturing an electroforming mold and a photomask.

BACKGROUND ART

For example, a structure having a minute shape such as a component of a timepiece is manufactured by electroforming (electroforming; a method for manufacturing, repairing, or replicating a metal product by an electroplating method). When a component (electroformed article) is manufactured by electroforming, a photoresist layer is formed on a substrate, and a pattern of a soluble portion and an insoluble portion is formed on the photoresist layer, thereby manufacturing an electroforming mold (see, for example, Patent Literature 1: JP 4550569 B2).

Examples of the electroforming mold using the pattern of a soluble portion and an insoluble portion include a formation method of emitting light using a photomask in which a pattern is formed by a light shielding portion and a light transmitting portion, and a formation method of irradiating a region corresponding to an insoluble portion by scanning laser light without using a photomask.

SUMMARY

Meanwhile, there is a phenomenon in which a photoresist layer is slightly deformed in an exposure step or a post exposure bake (PEB) (baking after exposure/before development) step after exposure in the case of a chemically amplified resist, and a corner portion of an electroforming mold is blunted. That is, the corner portion has a rounded end, and the resolution (sharpness) decreases. For this reason, in an electroformed article manufactured using an electroforming mold, the reproducibility of the end shape of the corner portion may deteriorate.

The present disclosure has been made in view of the above circumstances, and an object is to provide a method for manufacturing an electroforming mold, and a photomask capable of preventing an end of a corner portion in a pattern of a photoresist layer from being blunted.

A first of the present disclosure is a method for manufacturing an electroforming mold. The method includes: forming a pattern including a soluble portion and an insoluble portion in a photoresist layer stacked on a substrate; removing the soluble portion to form a cavity, and when a corner portion is formed in the soluble portion, forming a soluble portion corner correction portion that is configured to suppress a decrease in sharpness of the corner portion of the soluble portion in a region facing the corner portion of the soluble portion across a vertex of the corner portion of the soluble portion.

A second of the present disclosure is a method for manufacturing an electroforming mold. The method includes forming a pattern comprising a soluble portion and an insoluble portion in a photoresist layer stacked on a substrate; removing the soluble portion to form a cavity; and when a corner portion is formed in the insoluble portion, forming an insoluble portion corner correction portion that is configured to suppress a decrease in sharpness of the corner portion in a region facing the corner portion across a vertex of the corner portion.

A third of the present disclosure is a photomask for forming a pattern including a soluble portion and an insoluble portion in a photoresist layer formed by being stacked on a substrate. The photomask is provided with a pattern including a light shielding portion and a light transmitting portion. When a corner portion is formed in the light shielding portion, a light shielding portion corner correction portion configured to suppress a decrease in sharpness of the corner portion of the light shielding portion is formed in a region facing the corner portion of the light shielding portion across a vertex of the corner portion of the light shielding portion.

A fourth of the present disclosure is a photomask used for forming a pattern including a soluble portion and an insoluble portion in a photoresist layer formed by being stacked on a substrate. The photomask is provided with a pattern comprising a light shielding portion and a light transmitting portion. When a corner portion is formed in the light transmitting portion, a light transmitting portion corner correction portion configured to suppress a decrease in sharpness of the corner portion of the light transmitting portion is formed in a region facing the corner portion of the light transmitting portion across a vertex of the corner portion of the light transmitting portion.

DETAILED DESCRIPTION

Hereinafter, an embodiment of a method for manufacturing an electroforming mold, and a photomask according to the present disclosure will be described with reference to the drawings.

Figure 1:
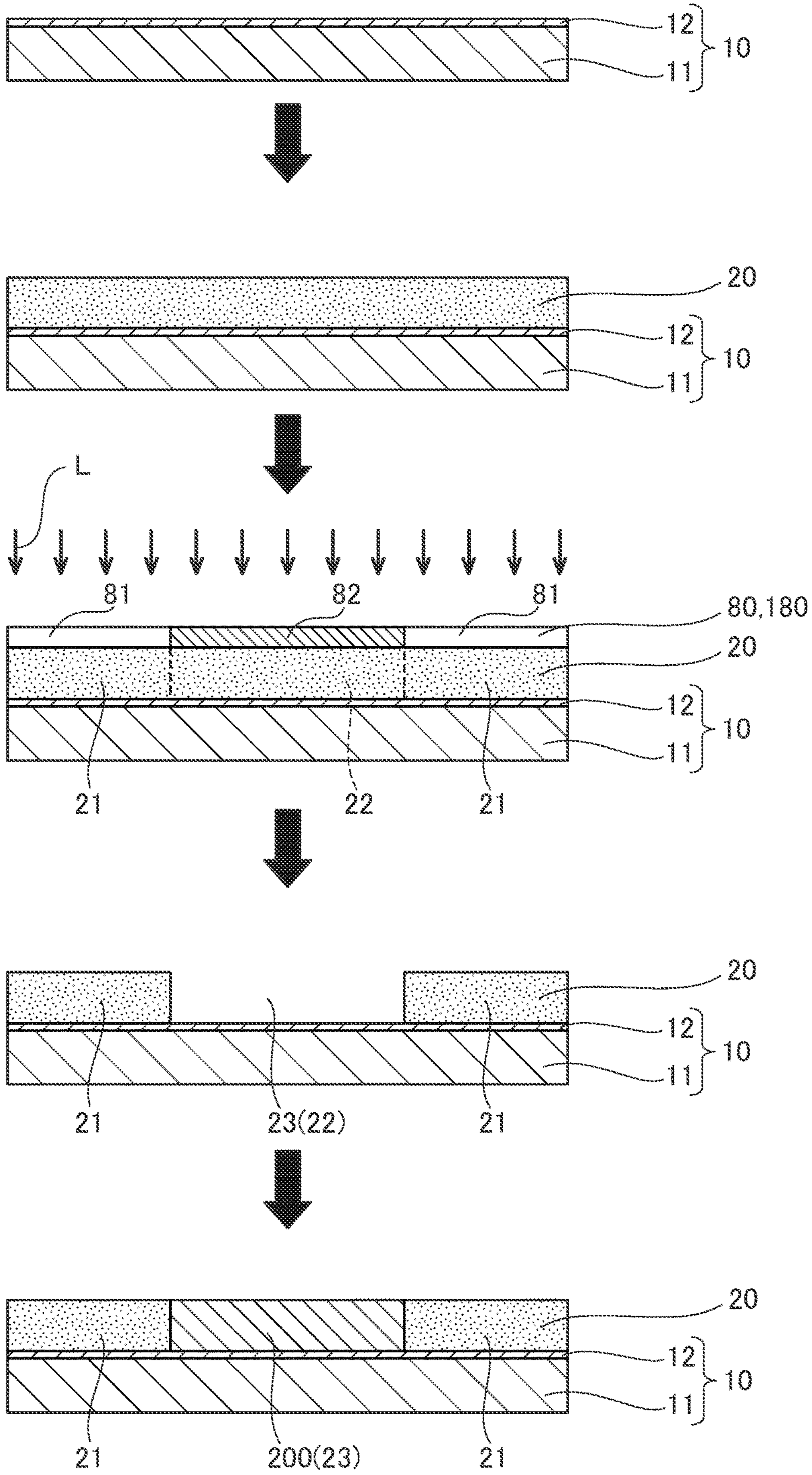
FIG. 1 is a cross-sectional view schematically illustrating a flow of a method for manufacturing an electroformed article to which an example of a method for manufacturing an electroforming mold is applied.

FIG. 1 is a cross-sectional view schematically illustrating a flow of an example of a method for manufacturing an electroformed article 200.

Figure 2:
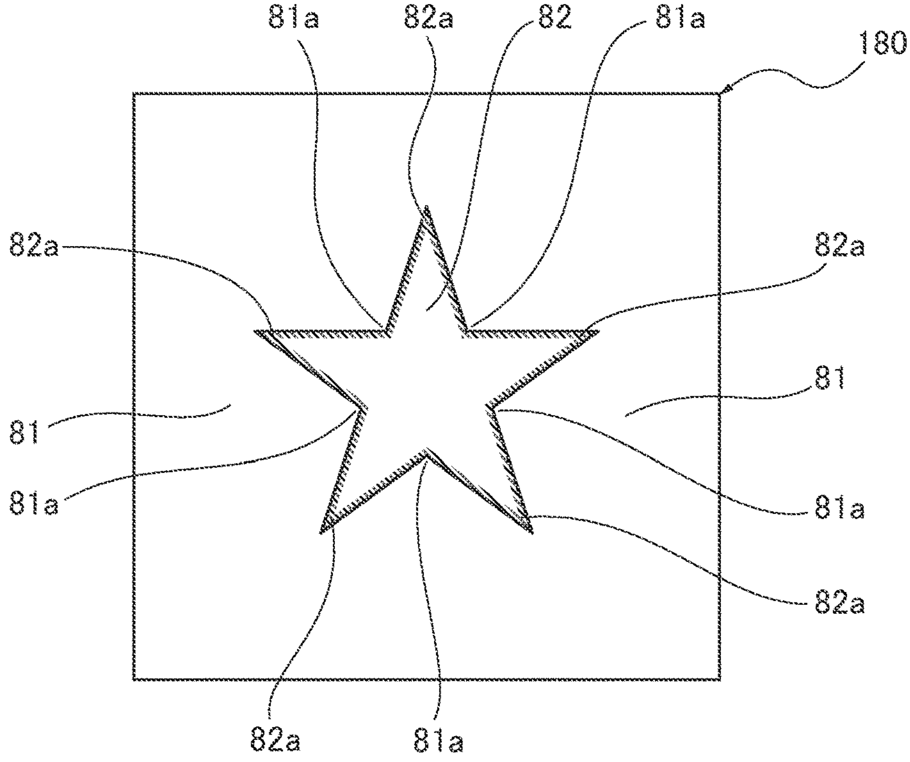
FIG. 2 is a plan view of an example of a conventionally used photomask in the method for manufacturing an electroforming mold illustrated in FIG. 1.
Figure 3:
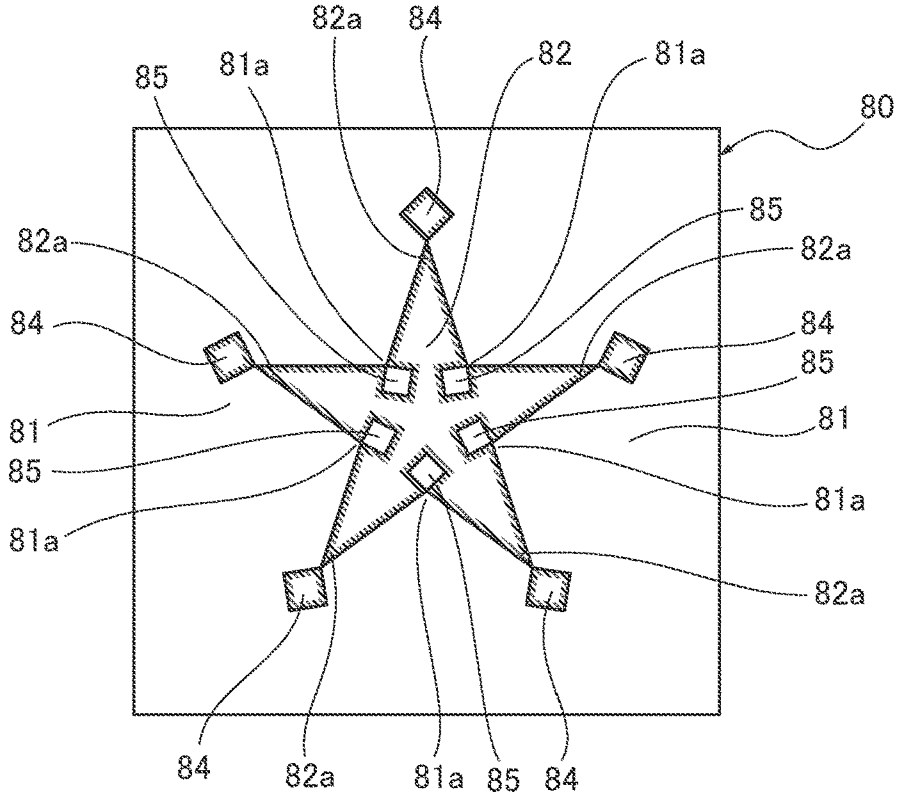
FIG. 3 is a plan view of an embodiment of a photomask according to the present disclosure used in the method for manufacturing an electroforming mold illustrated in FIG. 1.

FIG. 2 is a plan view of an example of a conventionally used photomask 180 in the method for manufacturing the electroformed article 200 illustrated in FIG. 1. FIG. 3 is a plan view of an embodiment of a photomask according to the present disclosure which is used in the method for manufacturing the electroformed article 200 illustrated in FIG. 1.

Note that, in the method for manufacturing the electroformed article 200 illustrated in FIG. 1, a method using a photomask 80 is a method for manufacturing the electroformed article 200 to which an embodiment of the method for manufacturing the electroforming mold according to the present disclosure is applied while a method using the photomask 180 is a method for manufacturing the electroformed article 200 to which an example of a conventional method for manufacturing the electroforming mold is applied.

In the method for manufacturing the electroformed article 200, as illustrated in FIG. 1, a photoresist layer 20 is placed on a substrate 10. In the substrate 10, a substrate main body 11 may have conductivity or may not have conductivity. In a case where the substrate main body 11 does not have conductivity and is, for example, resin, a conductive film (conductive layer) 12 having conductivity may be formed on a surface of the substrate main body 11 on which the photoresist layer 20 is placed.

When the substrate main body 11 has conductivity, the conductive film 12 may not be provided. In addition, when the substrate main body 11 does not have conductivity and the conductive film 12 is not formed, the conductive film may be formed at least in the cavity portion 23 after a cavity portion 23 is formed The photoresist layer 20 may be a positive resist or a negative resist. The positive resist includes a soluble portion and an insoluble portion. In the soluble portion of the positive resist, a portion where ultraviolet light (ultraviolet ray) is irradiated dissolves. The insoluble portion of the positive resist is a portion where the ultraviolet light (ultraviolet ray) is not irradiated. The negative resist includes an insoluble portion and a soluble portion. In the insoluble portion of the negative resist, a portion where the ultraviolet light (ultraviolet ray) is irradiated does not dissolve. The ultraviolet light (ultraviolet ray) is a portion where the ultraviolet light (ultraviolet ray) is not irradiated. Descriptions will be given on the assumption that the photoresist layer 20 in the method for manufacturing the electroformed article 200 illustrated in FIG. 1 is the negative resist.

In the method for manufacturing the electroformed article 200, the photomask 80 or photomask 180 is then disposed on the surface (upper surface in the drawing) side of the photoresist layer 20, and the photoresist layer 20 is irradiated with ultraviolet light L from above through the photomask 80 or photomask 180.

Each of the photomask 80 and the photomask 180 has a pattern including a light transmitting portion 81 that allows the ultraviolet light L to pass therethrough and a light shielding portion 82 that does not allow the ultraviolet light L to pass therethrough. The pattern forms an electroforming mold corresponding to the profile shape of the electroformed article 200.

When the ultraviolet light L is emitted through the photomasks 80, 180, a lower portion of the photoresist layer 20 below the light transmitting portion 81 becomes an insoluble portion 21 by being irradiated with the transmitted ultraviolet light L, and remains in a development process. On the other hand, a lower portion of the photoresist layer 20 below the light shielding portion 82 becomes a soluble portion 22 by not being irradiated with the shielded ultraviolet light L, and is removed in the development process.

Thus, the light shielding portion 82 of the photomask 80, 180 forms the soluble portion 22 in the photoresist layer 20, and the light transmitting portion 81 forms the insoluble portion 21 in the photoresist layer 20. Note that when the photoresist layer 20 is a positive resist, on the contrary, the light shielding portion 82 forms an insoluble portion in the photoresist layer 20, and the light transmitting portion 81 forms a soluble portion in the photoresist layer 20.

When the soluble portion 22 is removed by the development process, a portion where the soluble portion 22 existed becomes the cavity portion 23. The substrate 10 is brought into an exposed state in the cavity portion 23, and a pattern of the cavity portion 23 and the insoluble portion 21 becomes a mold (electroforming mold) for molding the electroformed article 200.

Then, in the cavity portion 23, metal such as nickel grows from the substrate 10 in an electroplating step, and the electroformed article 200 of metal such as nickel corresponding to the profile shape of the cavity portion 23 is manufactured. Note that when the substrate 10 is an insulator having no conductivity, it is sufficient if a conductive film is formed at least in the cavity portion 23 at this stage.

Here, descriptions will be given on the assumption that the photomask 180 used in the conventional method for manufacturing an electroforming mold has a pattern including a star-shaped light shielding portion 82 and a light transmitting portion 81 around the star-shaped light shielding portion 82 as illustrated, for example, in FIG. 2. Note that the star shape of the light shielding portion 82 is the profile shape of the electroformed article 200 to be manufactured.

Figure 4:
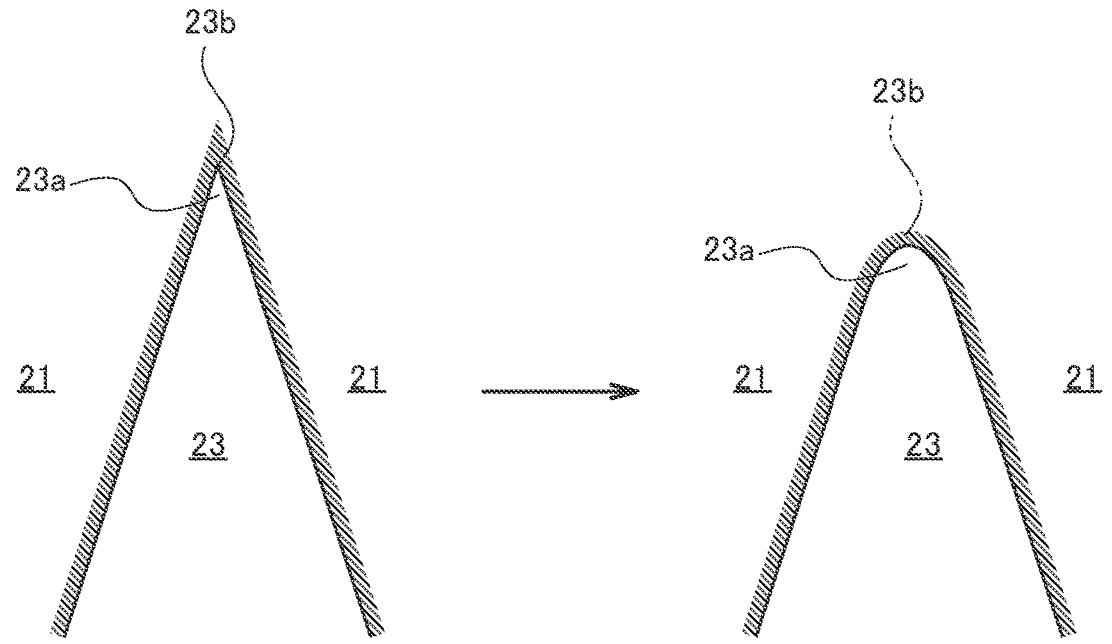
FIG. 4 is a view schematically illustrating a state of a corner portion formed in a cavity of a photoresist layer in a method for manufacturing an electroforming mold using a conventional photomask.

FIG. 4 is a view schematically illustrating a state of a corner portion 23*a* formed in the cavity portion 23 of the photoresist layer 20 in the method for manufacturing an electroforming mold using the conventional photomask 180. In this case, when the photomask 180 has a corner portion 82*a* (which is a portion bent at an angle less than 180 [degrees]) formed in the light shielding portion 82, the corner portion 23*a* of the cavity portion 23 to be originally formed corresponding to the corner portion 82*a* as illustrated in the left-half region of FIG. 4 results in an end of the corner portion 23*a* being blunted and rounded, and a vertex 23*b* of the end of the corner portion 23*a* disappearing as illustrated in the right-half region of FIG. 4.

Figure 5:
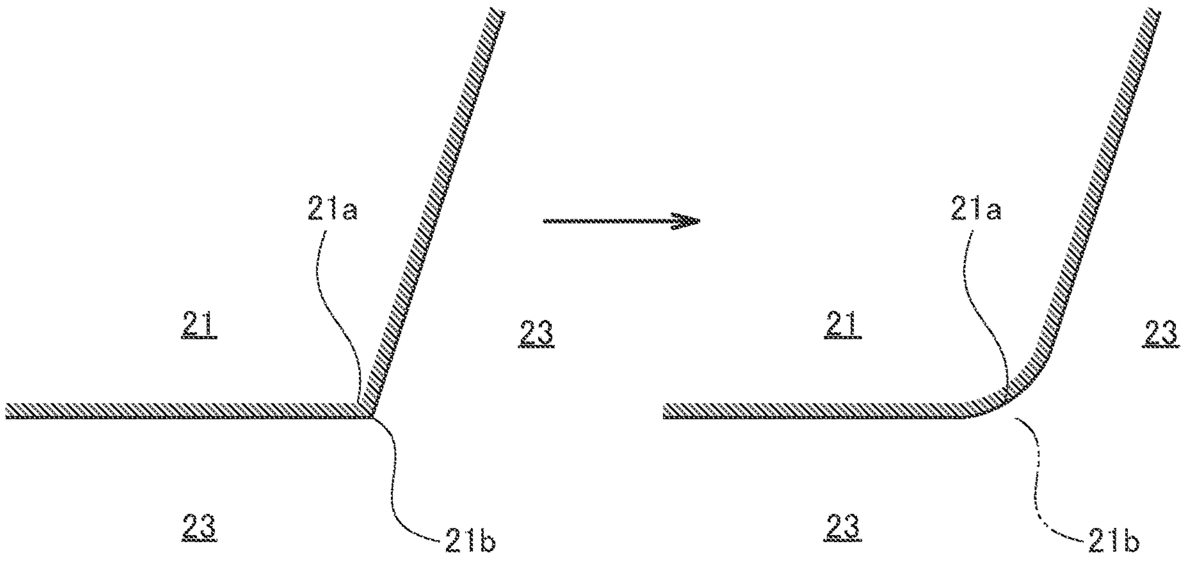
FIG. 5 is a view schematically illustrating a state of a corner portion formed in an insoluble portion of the photoresist layer in the method for manufacturing the electroforming mold using the conventional photomask.

FIG. 5 is a view schematically illustrating a state of a corner portion 21*a* formed in the insoluble portion 21 of the photoresist layer 20 in the method for manufacturing an electroforming mold using the conventional photomask 180. Also, when the photomask 180 has a corner portion 81*a* (which is a portion bent at an angle less than 180 [degrees]) formed in the light transmitting portion 81 as illustrated in FIG. 2, the corner portion 21*a* of the insoluble portion 21 to be originally formed corresponding to the corner portion 81*a* as illustrated in the left-half region of FIG. 5 results in an end of the corner portion 21*a* being blunted and rounded, and a vertex 21*b* of the end of the corner portion 21*a* disappearing and the cavity portion 23 expanding as illustrated in the right-half region of FIG. 5.

The reason why the end of the corner portion 21*a* of the insoluble portion 21 becomes blunt and rounded as described above is presumed to be that the insoluble portion 21 shrinks due to crosslinking between molecules of the insoluble portion 21 at the time of exposure with the ultraviolet light L or at the time of post exposure bake (PEB) (baking after exposure/before development) after exposure in a case where the photoresist layer 20 is a chemically amplified resist.

Also, the reason why the end of the corner portion 23*a* of the cavity portion 23 becomes blunt and rounded is presumed to be that pulling occurs between the two insoluble portions 21 sandwiching the corner portion 23*a* of the cavity portion 23 due to shrinkage caused by crosslinking between the molecules, and the insoluble portions 21 in the region facing the corner portion 23*a* across the vertex 23*b* are attracted to the corner portion by the stress of the pulling.

As described above, when the end of the corner portion 23*a* of the cavity portion 23 becomes blunt or the end of the corner portion 21*a* of the insoluble portion 21 becomes blunt, the shape of the cavity portion 23 does not reproduce the shape of the intended design, and the dimensions of the electroformed article 200 manufactured by the electroforming mold formed with the pattern of the cavity portion 23 and the insoluble portion 21 is different from the dimension of the intended design.

On the other hand, as illustrated in FIG. 3, the photomask 80 of the present embodiment also has a pattern including the star-shaped light shielding portion 82 and the light transmitting portion 81 around the star-shaped light shielding portion 82, and the star shape of the light shielding portion 82 is the profile shape of the electroformed article 200 to be manufactured.

In the photomask 80, when a corner portion 82*a* (which is a portion bent at an angle less than 180 [degrees]) is formed in the light shielding portion 82, a light shielding portion corner correction portion 84 is formed in a region facing the corner portion 82*a* of the light shielding portion 82 across a vertex 82*b* of the corner portion 82*a* of the light shielding portion 82. The light shielding portion corner correction portion 84 suppresses a decrease in sharpness of the corner portion 82*a* of the light shielding portion 82.

Similarly to the light shielding portion 82, the light shielding portion corner correction portion 84 is a light shielding portion that does not allow the ultraviolet light to pass therethrough. That is, the light shielding portion corner correction portion 84 forms a soluble portion corner correction portion 24 which is a soluble portion (cavity) in the photoresist layer 20.

Figure 6:
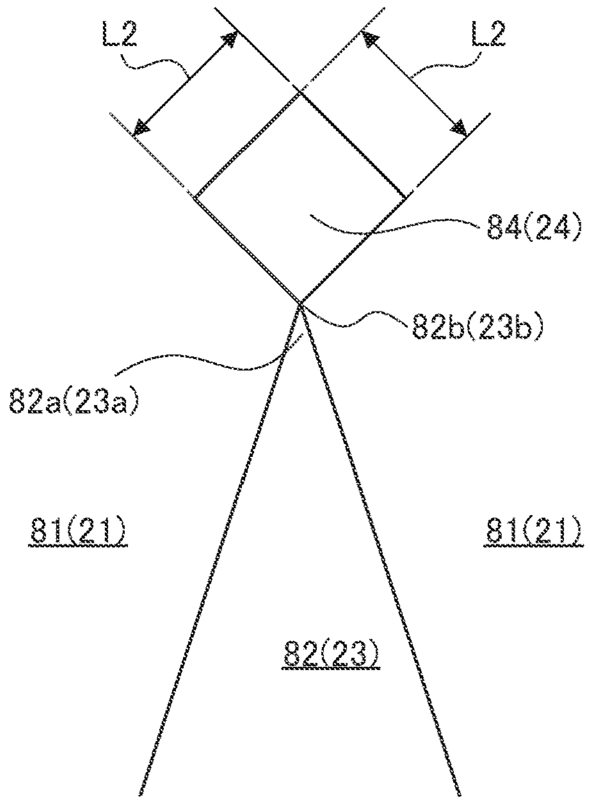
FIG. 6 is a view schematically illustrating details of a light shielding portion corner correction portion formed to face a corner portion of a light shielding portion of the photomask.
Figure 7:
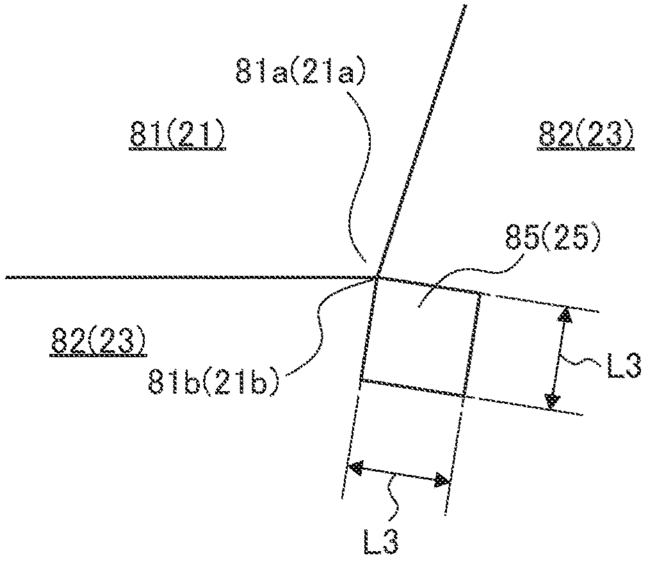
FIG. 7 is a view schematically illustrating details of a light transmitting portion corner correction portion formed to face a corner portion of a light transmitting portion of the photomask.

FIG. 6 is a view schematically illustrating details of the light shielding portion corner correction portion 84 formed to face the corner portion 82*a* of the light shielding portion 82 of the photomask 80. FIG. 7 is a view schematically illustrating details of a light transmitting portion corner correction portion 85 formed to face the corner portion 81*a* of the light transmitting portion 81 of the photomask 80.

Figure 8:
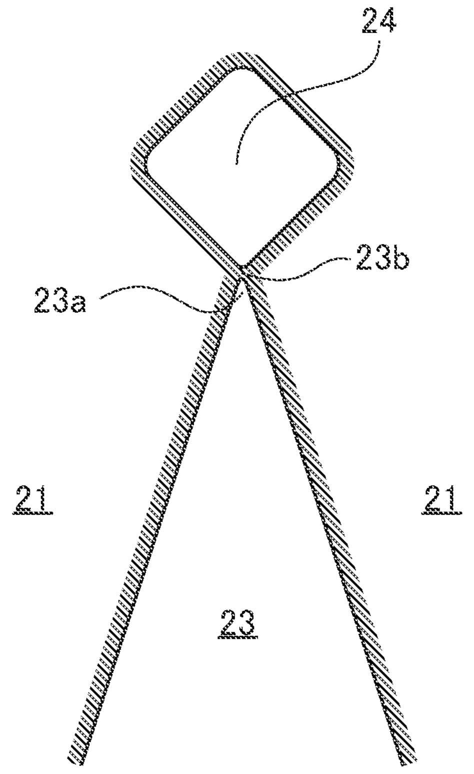
FIG. 8 is a view schematically illustrating a state of a corner portion formed in a cavity of the photoresist layer in the method for manufacturing the electroforming mold using the photomask of an embodiment.
Figure 9:
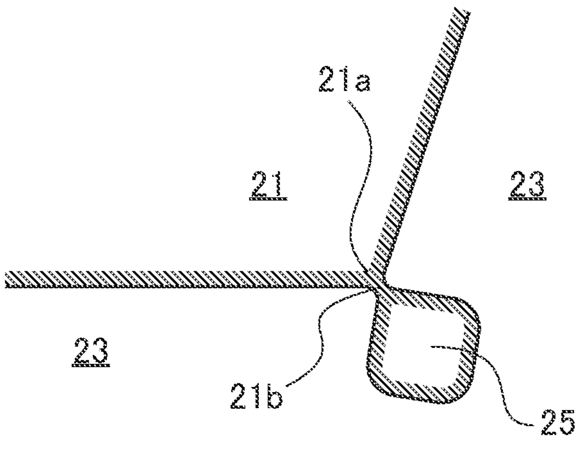
FIG. 9 is a view schematically illustrating a state of a corner portion formed in an insoluble portion of the photoresist layer in the method for manufacturing the electroforming mold using the photomask of an embodiment.

In addition, FIG. 8 is a view schematically illustrating the state of the corner portion 23*a* formed in the cavity portion 23 of the photoresist layer 20 in the method for manufacturing the electroformed article 200 to which the method for manufacturing the electroforming mold using the photomask 80 of the present embodiment is applied. FIG. 9 is a view schematically showing the state of the corner portion 21*a* formed in the insoluble portion 21 of the photoresist layer 20 in the method for manufacturing the electroformed article 200 to which the method for manufacturing the electroforming mold using the photomask 80 of the present embodiment is applied.

For example, as illustrated in FIG. 6, the light shielding portion corner correction portion 84 is formed in a rectangular shape. A length L2 of one side of the rectangle is, for example, 1 [$\mu$m], but is not limited to 1 [$\mu$m], and may be larger than 1 [$\mu$m] or smaller than 1 [$\mu$m]. In addition, the light shielding portion corner correction portion 84 is not limited to a rectangle. The shape of the light shielding portion corner correction portion 84 may be a triangle, another polygon, a circle, or another shape.

In short, it is sufficient if the light shielding portion corner correction portion 84 removes the insoluble portions 21 attracted to the vicinity of the vertex 23*b* of the corner portion 23*a* in the region facing the corner portion 23*a* across the vertex 23*b* even in a case where pulling occurs due to shrinkage caused by crosslinking between the molecules between the two insoluble portions 21 sandwiching the corner portion 23*a* of the cavity portion 23 formed by the light shielding portion 82.

In a case where the light shielding portion corner correction portion 84 is a rectangle or a polygon, it is preferable that the vertex of the portion 84 is formed in the orientation (pose) facing the corner portion 82*a* across the vertex 82*b* to alleviate the stress generated in the two insoluble portions 21 sandwiching the corner portion 23*a*. However, the sides of the rectangle or the polygon of the light shielding portion corner correction portion 84 may be formed in the orientation facing the corner portion 82*a* across the vertex 82*b*.

The light shielding portion corner correction portion 84 may have a configuration in which the light shielding portion corner correction portion 84 contacts the light shielding portion 82, wherein the light shielding portion corner correction portion 84 contacts the vertex 82*b* of the corner portion 82*a* of the light shielding portion 82 or a configuration in which the light shielding portion corner correction portion 84 is separated from the light shielding portion 82 wherein the light shielding portion corner correction portion 84 is separated from the vertex 82*b* of the corner portion 82*a* of the light shielding portion 82. The light shielding portion corner correction portion 84 may have a configuration in which the light shielding portion corner correction portion 84 overlaps the vertex 82*b* of the corner portion 82*a* of the light shielding portion 82 and the light shielding portion corner correction portion 84 and the light shielding portion 82 are connected. When the light shielding portion corner correction portion 84 is separated from the vertex 82*b* of the corner portion 82*a* of the light shielding portion 82, the separation distance is preferably 10 [μm] or less.

In addition, in the photomask 80, as illustrated in FIG. 3, when the corner portion 81*a* (which is a portion bent at an angle less than 180 [degrees]) is formed in the light transmitting portion 81, the light transmitting portion corner correction portion 85 is formed in a region facing the corner portion 81*a* of the light transmitting portion 81 across a vertex 81*b* of the corner portion 81*a* of the light transmitting portion 81. The light transmitting portion corner correction portion 85 suppresses a decrease in sharpness of the corner portion 81*a* of the light transmitting portion 81. Similarly to the light transmitting portion 81, the light transmitting portion corner correction portion 85 is a light transmitting portion that allows the ultraviolet light to pass therethrough. That is, the light transmitting portion corner correction portion 85 forms an insoluble portion corner correction portion 25 which is an insoluble portion in the photoresist layer 20.

For example, as illustrated in FIG. 7, the light transmitting portion corner correction portion 85 is formed in a rectangular shape. A length L3 of one side of the rectangle is, for example, 1 [μm], but is not limited to 1 [μm], and may be larger than 1 [μm] or smaller than 1 [μm]. In addition, the light transmitting portion corner correction portion 85 is not limited to a rectangle. The shape of the light transmitting portion corner correction portion 85 may be a triangle, another polygon, a circle, or another shape.

The light transmitting portion corner correction portion 85 has a configuration in which the light transmitting portion corner correction portion 85 contacts the light transmitting portion 81, wherein the vertex of the light transmitting portion corner correction portion 85 contacts the vertex 81*b* of the corner portion 81*a* of the light transmitting portion 81, or a configuration in which the light transmitting portion corner correction portion 85 and the light transmitting portion 81 are connected, wherein the vertex of the light transmitting portion corner correction portion 85 and the vertex 81*b* of the corner portion 81*a* overlap with each other.

In addition, it is preferable that the vertex of the rectangle or polygon of the light transmitting portion corner correction portion 85 is formed in the orientation facing the corner portion 81*a* across the vertex 81*b* to alleviate the stress generated in the corner portion 21*a*. However, the sides of the rectangle or the polygon of the light transmitting portion corner correction portion 85 may be formed in the orientation facing the corner portion 82*a* across the vertex 81*b*.

When an electroforming mold is manufactured in the step illustrated in FIG. 1 using the photomask 80 of the present embodiment configured as described above, as illustrated in FIG. 8, as compared with the case illustrated in the right-half region of FIG. 4 (the case of manufacture using the conventional photomask 180), the sharpness of the corner portion 23*a* of the electroforming mold can be prevented or suppressed from being decreased (blunted) by the soluble portion corner correction portion 24.

That is, even in a case where pulling occurs due to shrinkage caused by crosslinking between the molecules between the two insoluble portions 21 sandwiching the corner portion 23*a* of the cavity portion 23, the cavity is formed by the light shielding portion corner correction portion 84 in the region facing the corner portion 23*a* across the vertex 23*b* and the insoluble portion 21 (see the right-half region in FIG. 4) that is attracted to the vicinity of the vertex 23*b* of the corner portion 23*a* to decrease the sharpness of the corner portion 23*a* is not formed.

In addition, when the electroformed article 200 is manufactured in the step illustrated in FIG. 1 using the photomask 80, as compared with the case illustrated in the right-half region of FIG. 5 (the case of manufacture using the conventional photomask 180), the sharpness of the corner portion 21*a* of the electroforming mold can be prevented or suppressed from being decreased by the insoluble portion corner correction portion 25 as illustrated in FIG. 9.

That is, pulling occurs between the corner portion 21*a* of the insoluble portion 21 and the insoluble portion corner correction portion 25 formed by the light transmitting portion corner correction portion 85 due to shrinkage caused by crosslinking between the molecules, and a vertex 21*b* of the corner portion 21*a* remains.

As a result, according to the method for manufacturing an electroforming mold using the photomask 80 of the present embodiment, a decrease in the sharpness of the end of the corner portion 23*a* of the cavity portion 23 is prevented or suppressed, and a decrease in the end of the corner portion 21*a* of the insoluble portion 21 is prevented or suppressed, so that the shape of the cavity portion 23 can be produced as the shape of the intended design.

Therefore, according to the method for manufacturing the electroforming mold using the photomask 80 of the present embodiment, it is possible to prevent or suppress a decrease in the sharpness of the corner portions 21*a* and 23*a* as compared with the method for manufacturing the electroforming mold using the conventional photomask 180. As a result, according to the method for manufacturing the electroformed article to which the method for manufacturing the electroforming mold of the present embodiment is applied, the dimensional accuracy of the manufactured electroformed article 200 can be improved as compared with the method for manufacturing the electroformed article to which the conventional method for manufacturing the electroforming mold is applied.

Note that, in the electroforming mold manufactured by the method for manufacturing the electroforming mold using the photomask 80 of the present embodiment, the insoluble portion corner correction portion 25 is formed in a portion corresponding to the light transmitting portion corner correction portion 85. Therefore, in the electroformed article 200 manufactured using the electroforming mold having the insoluble portion corner correction portion 25, as illustrated in FIG. 10 as an example, a cavity 210 is formed in a portion corresponding to the light transmitting portion corner correction portion 85.

Figure 10:
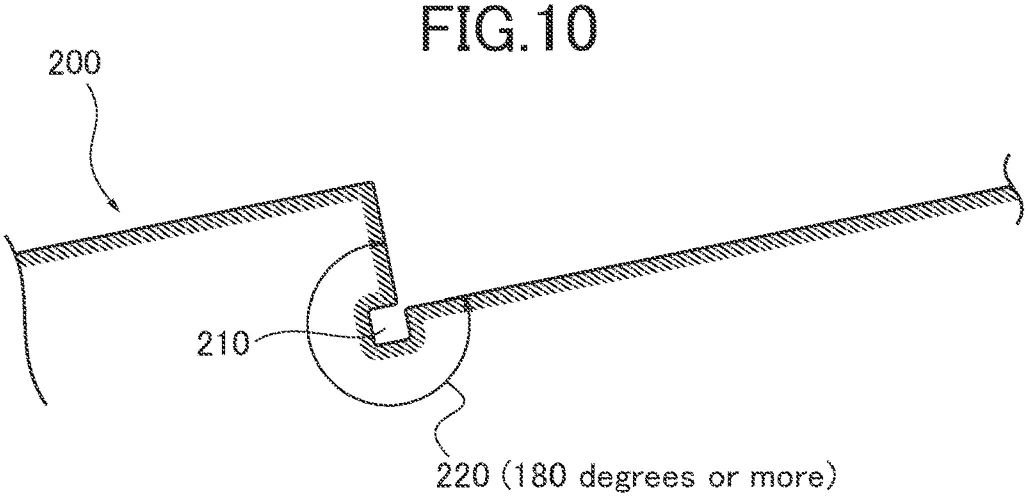
FIG. 10 is a view (part 1) describing the effect of the electroformed article manufactured by the electroforming mold manufactured by the method for manufacturing the electroforming mold using the photomask of an embodiment.

That is, as illustrated in FIG. 10, when the electroformed article 200 has a corner portion 220 bent over the angle of 180 [degrees], the cavity 210 corresponding to the insoluble portion corner correction portion 25 illustrated in FIG. 9 is formed in the corner portion 220.

Therefore, the weight of the electroformed article 200 can be reduced by the amount of the cavity 210 as compared with an electroformed article manufactured by the conventional manufacturing method by which the cavity 210 is not formed. Accordingly, energy can be saved as a result of the weight reduction when the electroformed article 200 is used as a moving object.

Figure 11:
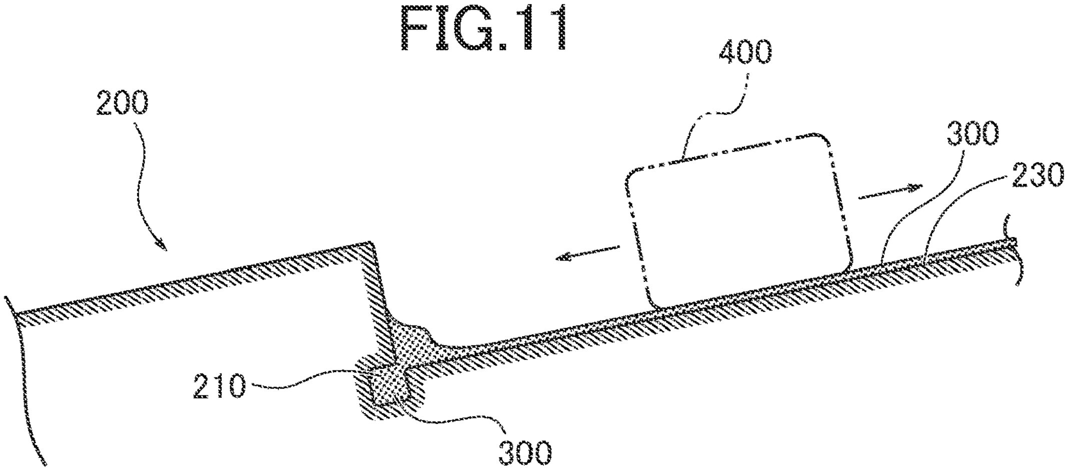
FIG. 11 is a view (part 2) describing the effect of the electroformed article manufactured by the electroforming mold manufactured by the method for manufacturing the electroforming mold using the photomask of an embodiment.

In addition, the electroformed article 200 having the corner portion 220 bent over the angle 180 [degrees] and formed with the cavity 210 can hold lubricating oil 300 in the cavity 210 and at a corner around the cavity 210, and the like when the lubricating oil 300 is applied to a surface 230 of the electroformed article 200, for example, as illustrated in FIG. 11.

Therefore, when the surface 230 of the electroformed article 200 slides with another object 400, the lubricating oil 300 held in the cavity 210 can be supplied to the sliding surface (the same as the surface 230) between the electroformed article 200 and the other object 400 to hold the lubricating oil 300 on the sliding surface (the surface 230), and the durability of the sliding surface (the surface 230) between the electroformed article 200 and the other object 400 can be improved (the life can be extended).

Figure 12:
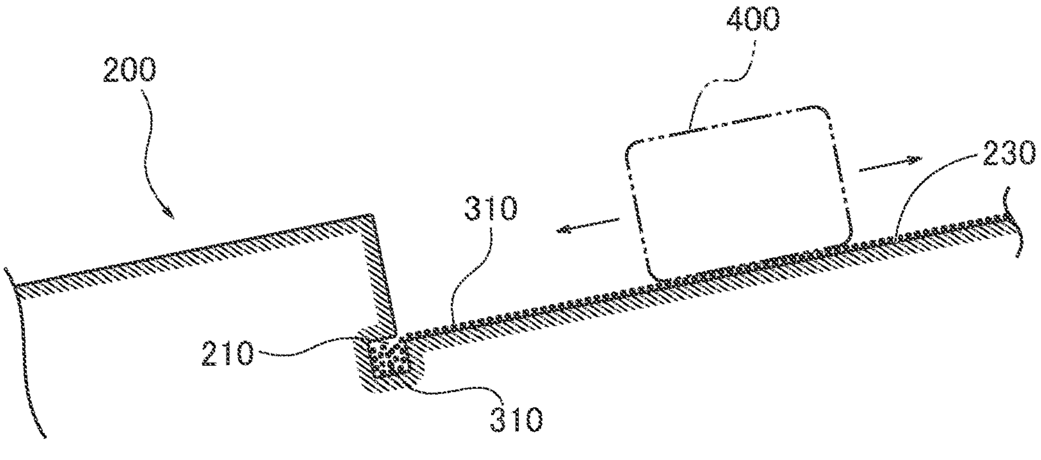
FIG. 12 is a view (part 3) describing the effect of the electroformed article manufactured by the electroforming mold manufactured by the method for manufacturing the electroforming mold using the photomask of an embodiment.

In addition, for example, as illustrated in FIG. 12, when the electroformed article 200 slides with the other object 400 and wear debris due to the sliding is generated or foreign matter from other components adheres onto the sliding surface (the surface 230) therebetween (the electroformed article 200 and the other object 400) (hereinafter, the wear debris and the foreign matter are referred to as wear debris 310, etc.), the wear debris 310, etc. enters the cavity 210 due to the sliding movement. For this reason, the wear debris 310, etc. can be prevented from staying on the sliding surface (the surface 230), and the durability of the sliding surface (the surface 230) between the electroformed article 200 and the other object 400 can be improved (the life can be extended).

Figure 13:
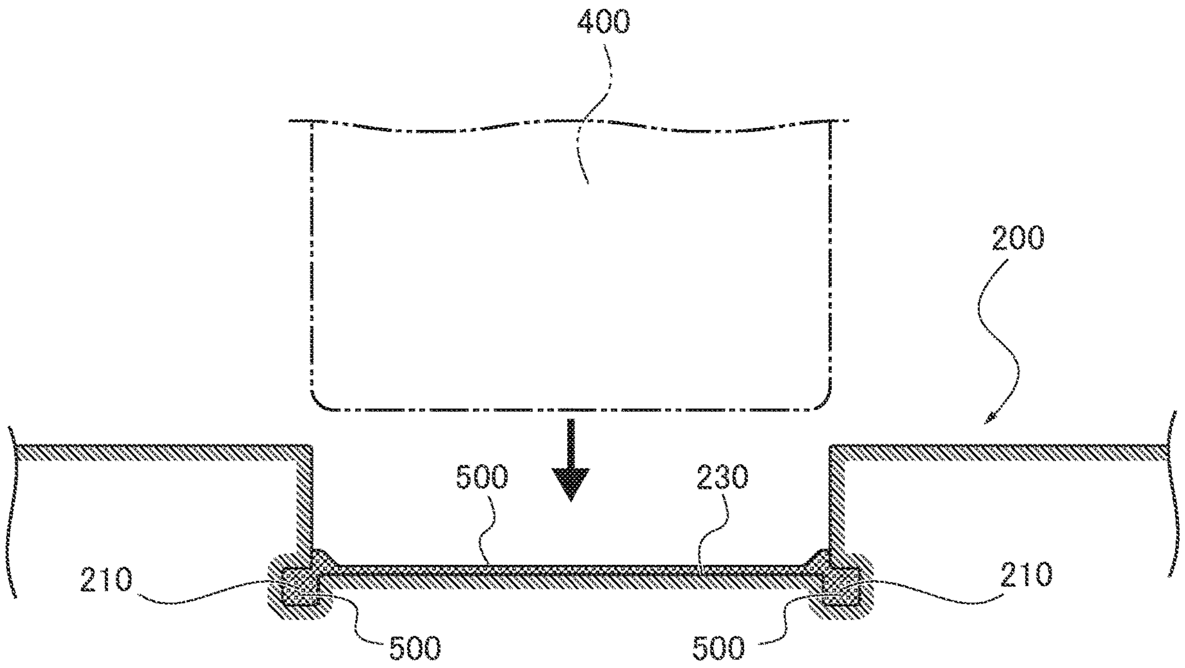
FIG. 13 is a view (part 4) describing the effect of the electroformed article manufactured by the electroforming mold manufactured by the method for manufacturing the electroforming mold using the photomask of an embodiment.

In addition, for example, as illustrated in FIG. 13, when the electroformed article 200 is bonded to the other object 400 by an adhesive 500, the adhesive 500 is applied in advance to the surface 230 of the electroformed article 200, and the adhesive 500 can be held in the cavity 210 in the corner portion 220 bent over the angle of 180 [degrees].

Therefore, in a case where the other object 400 is advanced toward the surface 230 of the electroformed article 200 in a direction shown with an arrow to bond the electroformed article 200 and the other object 400, the adhesive 500 held in the cavity 210, at the corner around the cavity 210, or the like is supplied between the electroformed article 200 and the other object 400. Accordingly, the adhesive 500 between the electroformed article 200 and the other object 400 can be sufficiently supplied, and the electroformed article 200 and the other object 400 can be firmly bonded.

Figure 14:
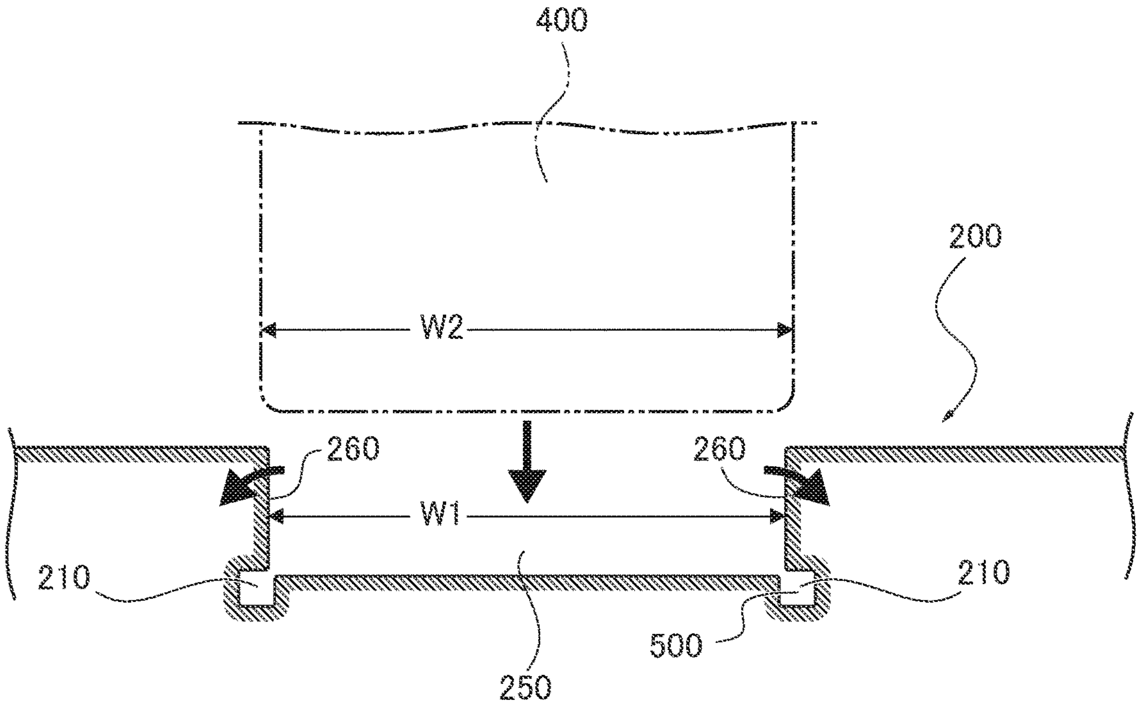
FIG. 14 is a view (part 5) describing the effect of the electroformed article manufactured by the electroforming mold manufactured by the method for manufacturing the electroforming mold using the photomask of an embodiment.

In addition, for example, as illustrated in FIG. 14, when the other object 400 having a width W2 (≈W1) substantially the same as width W1 or a width W2 (>W1) wider than the width W1 is inserted into a recess 250 having the width W1 formed in the electroformed article 200, the other object 400 inserted into the recess 250 presses the side portions 260, 260 which form the recess 250 outward in the width direction. At this time, the cavities 210, 210 formed in the corner portions 220 of the electroformed article 200 bent over the angle of 180 [degrees] are pressed and expanded, so that the side portions 260, 260 can be displaced (deformed) outward in the width direction.

Therefore, the other object 400 having the width W2 (≈W1) substantially the same as the width W1 or the width W2 (>W1) wider than the width W1 can be inserted into the recess 250 having the width W1 in the electroformed article 200.

In the method for manufacturing the electroforming mold of the present embodiment, the photoresist layer 20 to be exposed with the ultraviolet light L using the photomask 80 is a negative resist. However, in the method for manufacturing the electroforming mold according to the present disclosure, the photoresist layer 20 to be exposed with the ultraviolet light L using the photomask 80 may be a positive resist.

In this case, the light shielding portion 82, which is illustrated in FIGS. 6 and 7, of the photomask 80 forms the insoluble portion of the photoresist layer 20, and the light transmitting portion 81 forms the soluble portion of the photoresist layer 20. Then, in the photoresist layer 20, in FIGS. 8 and 9, a portion denoted by reference numeral 21 becomes a soluble portion (cavity), a portion denoted by reference numeral 25 becomes a soluble portion corner correction portion, which is a cavity, a portion denoted by reference numeral 23 becomes an insoluble portion, and a portion denoted by reference numeral 24 becomes an insoluble portion corner correction portion.

For this reason, when a photoresist layer of a positive resist is used in the method for manufacturing the electroforming mold of the present disclosure, it is sufficient if the light shielding portion corner correction portion 84 is configured to be in contact with or connected to the light shielding portion 82, and the light transmitting portion corner correction portion 85 is configured to be located close to the light transmitting portion 81 at a distance of 0 to 10 [μm], or separated from the light transmitting portion 81, or connected to the light transmitting portion 81.

In the method for manufacturing the electroforming mold, and the photomask 80 of the embodiment described above, the electroforming mold with the pattern including the corner portion 23*a* of the soluble portion 22 (cavity portion 23) and the corner portion 21*a* of the insoluble portion 21 in the photoresist layer 20 is formed. However, the method for manufacturing the electroforming mold and the photomask according to the present disclosure may form a pattern including only the corner portion of the soluble portion (cavity) or may form a pattern including only the corner portion of the insoluble portion in the photoresist layer.

The method for manufacturing the electroforming mold of the present embodiment is the method for manufacturing the electroforming mold in which the electroforming mold is formed with the pattern of the soluble portion 22 and the insoluble portion 21 in the photoresist layer 20 which is the negative resist (in the case of the positive resist photoresist layer 20, the soluble portion and the insoluble portion are reversed) using the photomask 80 formed with the pattern having the light shielding portion 82 for shielding the ultraviolet light L and the light transmitting portion 81 for transmitting the ultraviolet light L. However, the method for manufacturing the electroforming mold according to the present disclosure is not limited to the method for exposing the photoresist layer using the photomask.

That is, the method for manufacturing the electroforming mold according to the present disclosure may be a manufacturing method for manufacturing the electroforming mold with the pattern including the soluble portion and the insoluble portion by scanning a region (soluble portion and soluble portion corner correction portion in positive resist, and insoluble portion and insoluble portion corner correction portion in negative resist) of the photoresist layer to be exposed through the light transmitting portion of the photomask with, for example, laser light without using the photomask and not irradiating a region (insoluble portion and insoluble portion corner correction portion in positive resist, and soluble portion and soluble portion corner correction portion in negative resist) of the photoresist layer to be shielded by the light shielding portion of the photomask with the laser light.

The invention claimed is:

1. A method for manufacturing an electroforming mold, the method comprising:

forming a pattern comprising a soluble portion and an insoluble portion in a photoresist layer stacked on a substrate;

removing the soluble portion to form a cavity; and when a corner portion is formed in the soluble portion, forming a soluble portion corner correction portion that is configured to suppress a decrease in sharpness of the corner portion of the soluble portion in a region facing the corner portion of the soluble portion across a vertex of the corner portion of the soluble portion.

2. The method according to claim 1, wherein the method further comprises:

when a corner portion is formed in the insoluble portion, forming an insoluble portion corner correction portion that is configured to suppress a decrease in sharpness of the corner portion of the insoluble portion in a region facing the corner portion of the insoluble portion across a vertex of the corner portion of the insoluble portion.

* * * * *